United States Patent [19]

Takemae

[11] 4,365,319
[45] Dec. 21, 1982

[54] SEMICONDUCTOR MEMORY DEVICE

[75] Inventor: Yoshihiro Takemae, Yokohama, Japan

[73] Assignee: Fujitsu Limited, Kawasaki, Japan

[21] Appl. No.: 206,272

[22] Filed: Nov. 12, 1980

[30] Foreign Application Priority Data

Nov. 13, 1979 [JP] Japan ............................ 54-157393[U]

[51] Int. Cl.³ .............................................. G11C 7/00
[52] U.S. Cl. ..................................................... 365/200
[58] Field of Search ................ 365/200, 230; 307/475

[56] References Cited

U.S. PATENT DOCUMENTS 3,753,244  8/1973  Sumilas et al. .................... 365/200

*Primary Examiner*—James W. Moffitt
*Attorney, Agent, or Firm*—Staas & Halsey

[57] ABSTRACT

A semiconductor device, in which a redundancy memory cell array is incorporated with a main memory cell matrix. One memory cell array is selected by two kinds of decoders and drivers. When the redundancy memory cell array is selected by a decoder, the decoder disables one kind of the decoders and drivers directly and, as a result, the other kind of the decoders and drivers are also disabled.

10 Claims, 11 Drawing Figures

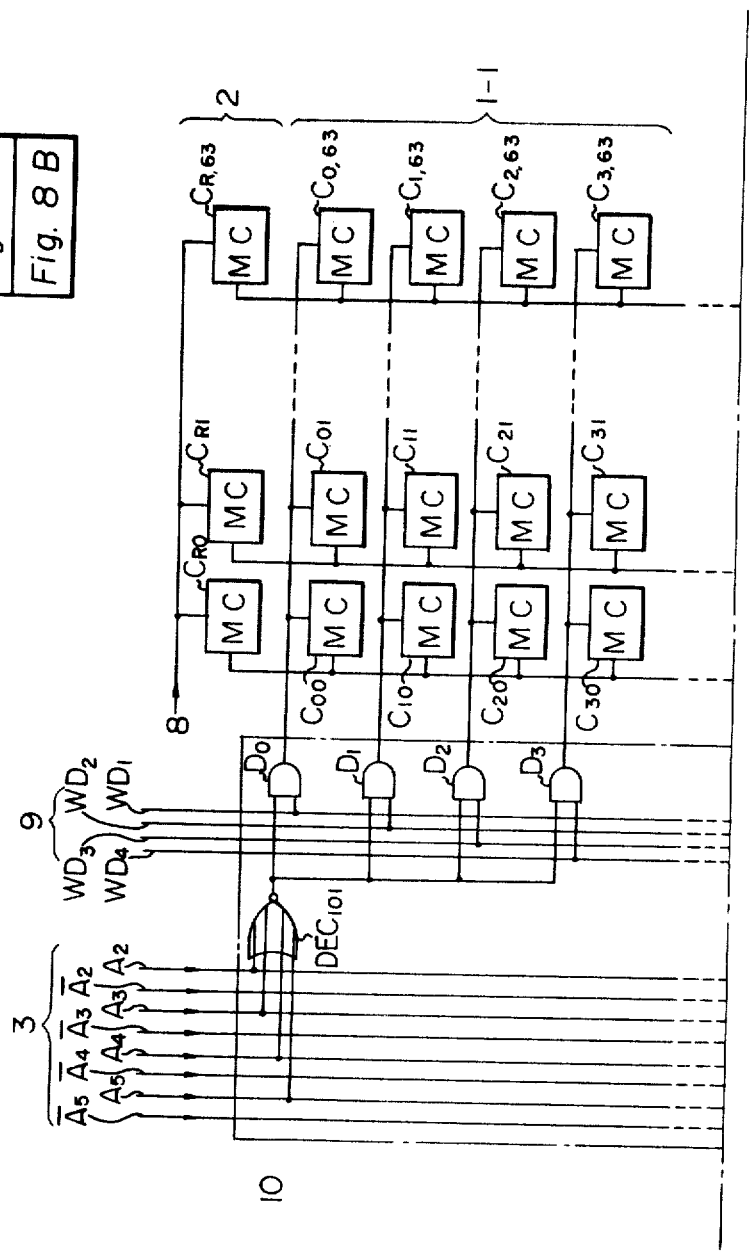

4,365,319

SEMICONDUCTOR MEMORY DEVICE

BACKGROUND OF THE INVENTION

The present invention relates to a semiconductor memory device and, more particularly, to a semiconductor memory device including a redundancy memory cell array therein.

A semiconductor memory device comprises a large number of memory cells arranged along orthogonal rows and columns. A density of defects generated in such a semiconductor memory device during manufacturing is relatively independent of the integration density of the device, but depends on semiconductor manufacturing technology. Therefore, the higher the integration density of the device, the greater the ratio of the number of normal memory cells to that of defective memory cells. This is one of the advantages obtained by increasing the integration density of a semiconductor memory device. However, even if the device has only one defective memory cell, the device cannot operate normally, and therefore is abandoned.

Previously, to operate a semiconductor memory device despite a defective memory cell, a redundancy memory cell array is incorporated with a main memory cell matrix along rows or columns thereof. Therefore, if a defective memory cell is detected, the redundancy memory cell array is used instead of the row memory cell array or the column memory cell array containing the defective memory cell. Incorporating a redundancy memory cell array in a semiconductor memory device, improves the manufacturing yield of the device.

One proposed semiconductor memory device containing a redundancy memory cell array comprises a first row address decoder means for selecting a row memory cell array within the main memory cell matrix, a second decoder means for selecting the redundancy memory cell array and a switching means for stopping the transmission of a clock signal for driving the first decoder means. The second decoder means includes a programmable read-only memory (PROM) into which a row address corresponding to the row containing the defective memory cell is written. Therefore, when the address of the defective row is supplied to the second decoder means, it selects the redundancy memory cell array and simultaneously activates the switching means disabling the first decoder means so that the defective row memory cell array is not selected. That is, the redundancy memory cell array is selected instead of the defective row memory cell array. However, in this device, since the current flowing through the switching means is relatively large, the area of switching transistors used for the switching means is large. This increases the areas of the memory device.

Another proposed semiconductor device, including the redundancy memory cell array and the first and second decoder means, comprises a disabling means in the row address decoder means instead of the above-mentioned switching means. In this device, when the defective row address is supplied to the second decoder means, the decoder means selects the redundancy memory array, and simultaneously disables each row decoder via the disabling means, so that the defective row memory cell array is not selected. That is, the redundancy memory cell array is selected instead of the defective row memory cell array. In this device, the area of the transistors used in the disabling means is relatively small, since currents flowing therethrough are small. However, a large number of such transistors are necessary, one for each row of the main memory cell matrix. As a result, the entire device is large.

On the other hand, a semiconductor memory device has been suggested in which a main memory cell matrix is divided into a plurality of sub memory cell matrixes. One row memory cell array is selected by selecting one of the sub memory cell matrixes and selecting one memory cell array among each sub memory cell matrix. In this device, the row decoders (and the column decoders) are simple and small in electrical structure.

SUMMARY OF THE INVENTION

It is a principal object of the present invention to provide a semiconductor memory device containing a redundancy memory cell array occupying only a small area of the device.

According to the present invention, there is provided a semiconductor memory device comprising a main memory cell matrix divided into a plurality of sub memory cell matrixes; a redundancy memory cell array incorporated into the main memory cell matrix, a first decoder means for selecting, in accordance with a first part of a first address information, one memory cell array parallel to the redundancy memory cell array within each sub memory cell matrix, the first decoder means is triggered by a clock signal; a second decoder means for selecting one of the sub memory cell matrixes within the main memory cell matrix, in accordance with a second part of the first address information, the driver portion of the second decoder means is triggered by output signals of the first decoder means; a third decoder means for selecting the redundancy memory cell array and disabling the second decoder means, in accordance with the first address information; and a fourth decoder means for selecting a memory cell array perpendicular to, both the redundancy memory cell array within the main memory cell matrix and the redundancy memory array, in accordance with a second address information. The second decoder means is prevented from generating output signals when the third decoder means selects the redundancy memory cell array. In this device, disabling means is included in the second decoder means which is much simpler than the conventional decoder means. Therefore, the number of transistors used in the disabling means is reduced, and the area of each is small, thus reducing the area of the entire device.

The present invention will be more clearly understood from the description of the preferred embodiments and with reference to the accompanying drawings.

BRIEF DESCRIPTION OF THE DRAWINGS

FIGS. 8A, 8B and 9 are a logic circuit diagram and a circuit diagram, respectively, of the row address decoders and drivers 10 of FIG. 5.

DESCRIPTION OF THE PREFERRED EMBODIMENTS

Figure 1:
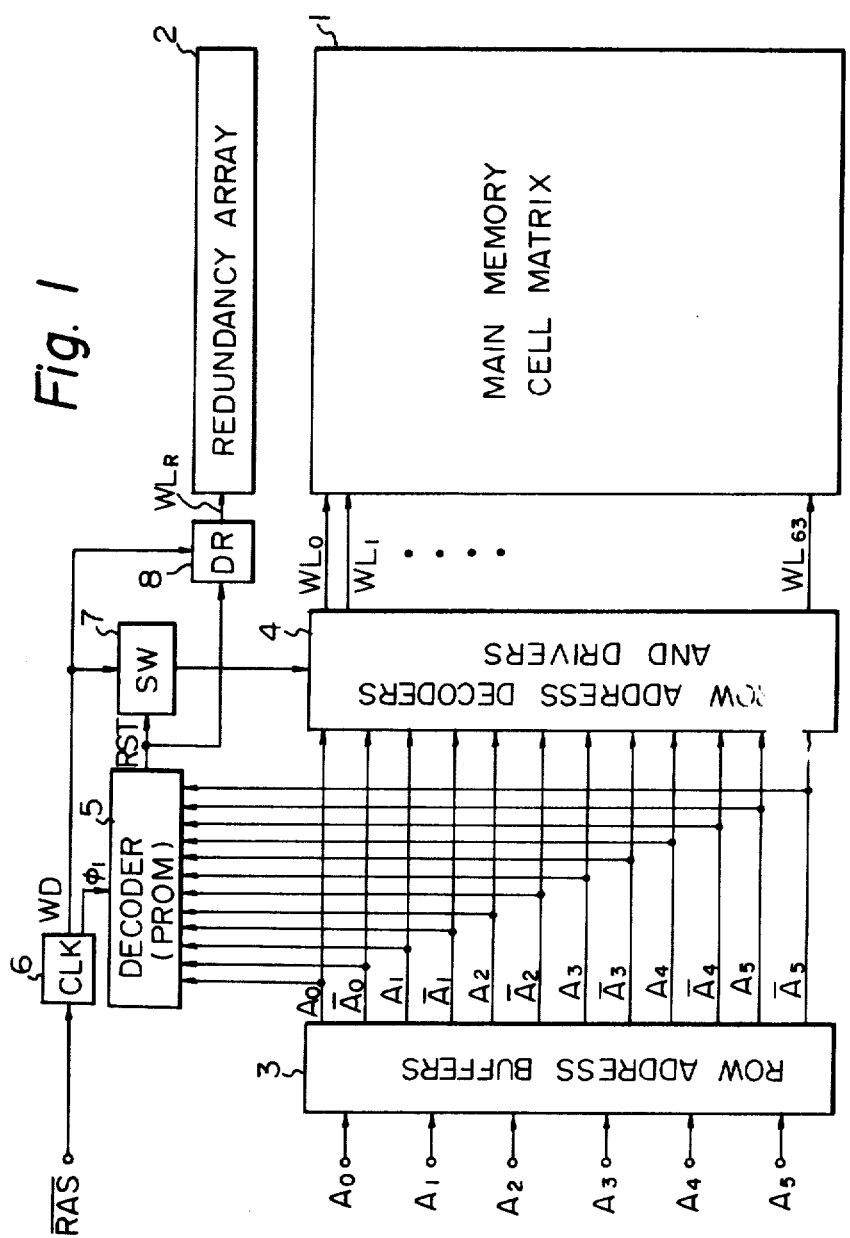
FIG. 1 is a block diagram illustrating one proposed semiconductor memory device including a redundancy memory cell array therein.

FIG. 1 illustrates a proposed semiconductor device including a redundancy memory cell array. The device comprises a main memory cell matrix 1, for example, 4096 ($=2^{12}$) dynamic or static MOS memory cells, and a redundancy memory cell array 2 which is incorporated with the main memory cell matrix 1 along rows thereof. Also included are row address buffers 3 which convert TTL address signals $A_0(=2^0)$, $A_1(=2^1)$, ..., $A_5(=2^5)$ into MOS level address signals $A_0, A_1, ... A_5$ and inverted signals $\bar{A}_0, \bar{A}_1, ... \bar{A}_5$. The level shifted signals are applied to row address decoders and drivers 4 to select one row memory cell array within the main memory cell matrix 1 and to decoder 5. Decoder 5, comprises a PROM (programmable read-only memory) which selects the redundancy memory cell array 2 via driver 8.

Note that decoders and drivers 4, decoder 5 and driver 8 are activated by clock signal WD, generated by clock 6 from the row address strobe signal, $\overline{RAS}$. In this case, the decoders and drivers 4 receive the signal WD through switching circuit 7.

If a defective memory cell is detected in the main memory cell matrix 1, the row address of the defective memory cell is written into decoder (PROM) 5. When the main memory cell matrix 1 contains no defective memory cell, decoder 5 does not select the redundancy memory cell array 2.

Note also that, the device comprises column address buffers, column address decoders and drivers, sense amplifiers, a data input buffer, a data output buffer or the like that are not shown in FIG. 1.

The operation of the device of FIG. 1 will be now explained.

Usually, all memory cells of the main memory cell matrix 1 of a completed semiconductor memory device are tested. After testing, if all of the memory cells of the main memory matrix 1 are to be normal, the operation of the device is the same as that of a memory device without the redundancy memory cell array 2, the decoder 5 and the switching circuit 7. In this case, one row array is selected from the main memory cell matrix 1 by the row address decoders and drivers 4. Then one column array is selected from the main memory cell matrix 1 by the column address decoders and drivers (not shown), so that the desired memory cell at the intersecting portion of the row array and the column is selected. Next, data stored in the desired memory cell is read out to the data output buffer (not shown), or new data of the data input buffer (not shown) is written into the desired memory cell.

Contrary to the above, if one or more defective memory cells are detected in one memory array row of the main memory cell matrix 1, that row's address (hereinafter referred to as a defective row address $ADD_x$) is written into decoder 5 by using output signals $A_0, \bar{A}_0, A_1, \bar{A}_1, ..., A_5, \bar{A}_5$ of row address buffers 3. Therefore, either the row address decoders and drivers 4 or the decoder 5 decode the signals $A_0, \bar{A}_0, A_1, \bar{A}_1, ..., A_5, \bar{A}_5$ of row address buffers 3. For example, when the signals $A_0, \bar{A}_0, A_1, \bar{A}_1, ..., A_5, \bar{A}_5$ do not correspond to the defective row address $ADD_x$, decoder 5 does not operate, and row address decoders and drivers 4 select the row array within the main memory cell matrix 1. After that, the column address decoders and drivers (not shown) select the column array of the main memory cell matrix 1. As a result, a normal memory cell of the main memory cell matrix 1 is selected. But, when the signals $A_0, \bar{A}_0, A_1, \bar{A}_1, ..., A_5, \bar{A}_5$ correspond to the defective row address $ADD_x$, decoder 5 generates a signal RST and activates driver 8 which selects the redundancy memory cell array 2 enabling any of the memory cells of array 2. Simultaneously, the signal RST disables switching circuit 7 and stops the transmission of clock signal WD of clock 6 to row address decoders and drivers 4, thus disabling the decoder and drivers 4. After that, the column address decoders and drivers (not shown) select one memory cell of the redundancy memory cell array 2.

However, in the device of FIG. 1, since the current of the clock signal WD flowing through the switching circuit 7 is relatively large, the area occupied by transistors forming the circuit 7 is relatively large resulting in a large area for the entire device.

Figure 2:
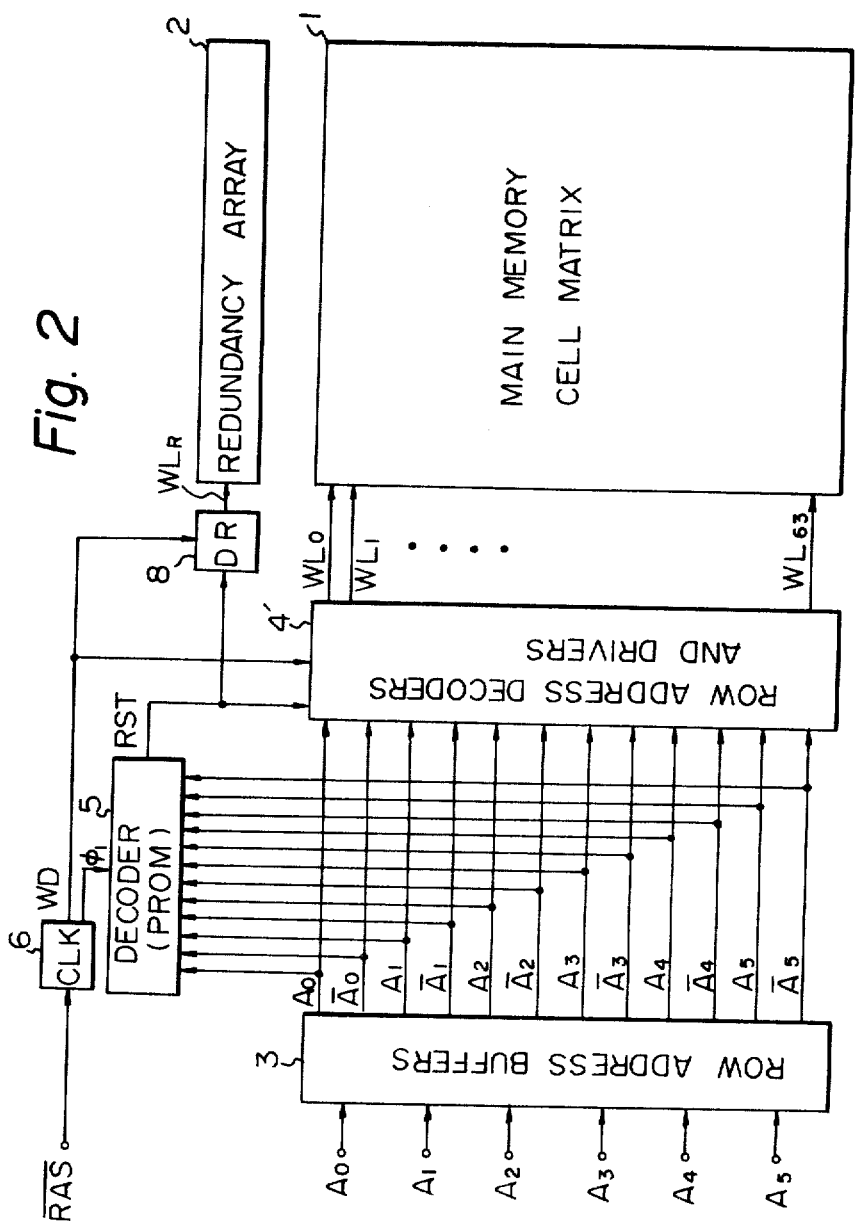
FIG. 2 is a block diagram illustrating another proposed semiconductor memory device including a redundancy memory cell array therein.

FIG. 2 is a block diagram illustrating another proposed semiconductor memory device including a redundancy memory cell array. The elements which are the same as those of FIG. 1 are denoted by the same reference numerals. However, in FIG. 2, switching circuit 7 in FIG. 1 is not illustrated and signal RST of decoder 5 is supplied directly to the row address decoders and drivers 4'.

Figure 3:
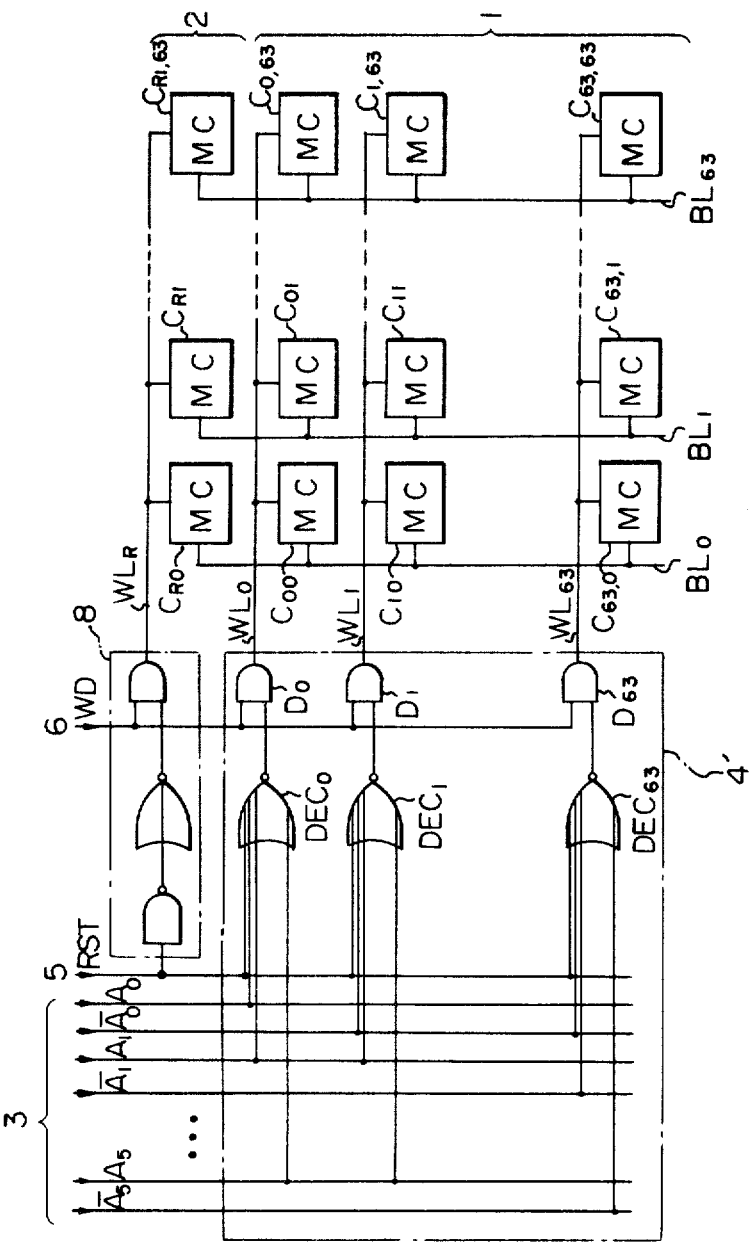
FIGS. 3 and 4 are a logic circuit diagram and a circuit diagram, respectively, of the row address decoders and drivers 4' of FIG. 2.

FIG. 3 is a logic circuit diagram of the row address decoders and drivers 4' of FIG. 2. The row address decoders and drivers 4' comprise decoders $DEC_0, DEC_1, ..., DEC_{63}$ formed by NOR gates and word drivers $D_0, D_1, ..., D_{63}$ formed by AND gates, each connected to one of the decoders $DEC_0, DEC_1, ..., DEC_{63}$. Each decoder receives address signals $A_0$ (or $\bar{A}_0$), $A_1$ (or $\bar{A}_1$) ..., $A_5$ (or $\bar{A}_5$) from address buffers 3 (FIG. 2) and signal RST from decoder 5 (FIG. 2), while each driver receives clock signal WD from clock 6 (FIG. 2). When the potentials of signals RST and WD are low and high, respectively, one of word lines $WL_0, WL_1, ..., WL_{63}$ corresponding to the active address signals $A_0, \bar{A}_0, A_1, \bar{A}_1, ..., A_5, \bar{A}_5$ is selected. The word lines $WL_0, WL_1, ..., WL_{63}$ are connected, respectively, to the 1st row memory cell array comprised of memory cells $C_{00}, C_{01}, ..., C_{0,63}$; and 2nd row memory cell array comprised of memory cells $C_{10}, C_{11}, ..., C_{1,63}$; and the 64th row memory cell array comprised of memory cells $C_{63,0}, C_{63,1}, ..., C_{63,63}$. Contrary to this, when the potentials of signals RST and WD are high, driver 8 selects a word line $WL_R$ which is connected to redundancy memory cell array 2 comprised of memory cells $C_{R0}, C_{R1}, ..., C_{R1,63}$.

Figure 4:
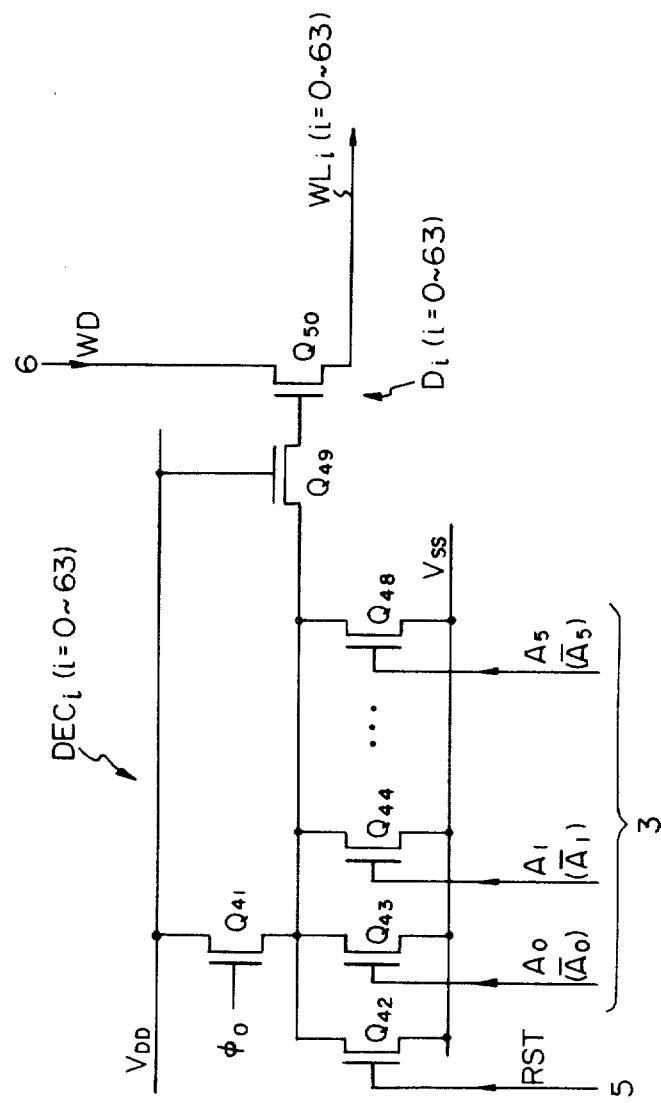

FIG. 4 is a circuit diagram of the row address decoders and drivers 4' of FIG. 2. Each decoder $DEC_i$ (i=0 through 63) comprises a load transistor $Q_{41}$ which receives a clock signal $\phi_0$, a transistor $Q_{42}$ for receiving signal RST, transistors $Q_{43}$ through $Q_{48}$ for receiving the address signals $A_0$ (or $\bar{A}_0$), $A_1$ (or $\bar{A}_1$), ..., $A_5$ (or $\bar{A}_5$) and a transistor $Q_{49}$ serving as a transfer gate. The decoder is reset by $\phi_0$ having a high potential. In addition, each word driver $D_i$ (i=0 through 63) comprises a transistor $Q_{50}$ having a gate connected to the decoder $DEC_i$, a drain for receiving the signal and a source connected to the word line $WL_i$. In this case, the areas of the transistors $Q_{41}$ through $Q_{48}$ are relatively small, since each current flowing there through is relatively small.

It should be noted that, in the row address decoders and drivers 4' of FIG. 2, only the transistors $Q_{42}$ (FIG. 4) are added as compared with the row address decoders and drivers 4 of FIG. 1. In this case, the area of each of the transistors $Q_{42}$ is relatively small; however, a large number of transistors $Q_{42}$, for example, sixty-four in the case of a 4,096 bit memory device, are necessary. Thus, the area of the entire device becomes large.

Figure 5:
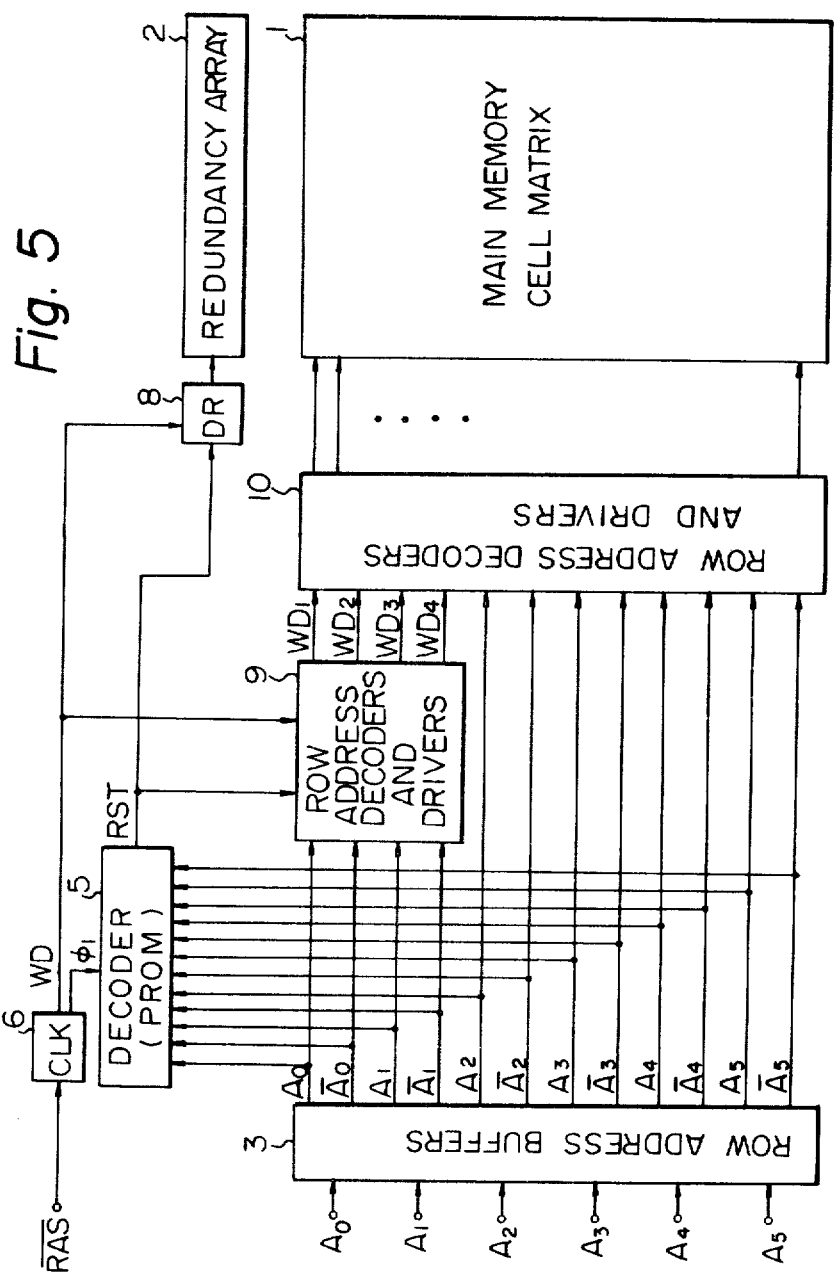
FIG. 5 is a block diagram illustrating an embodiment of the semiconductor memory device including a redundancy memory cell array according to the present invention.

FIG. 5 is a block diagram illustrating an embodiment of the semiconductor memory device according to the present invention. The elements which are the same as those of FIG. 2, are denoted by the same reference numerals. However, row address decoders and drivers 9 and 10 are provided instead of the row address decoders and drivers 4' of FIG. 2. In FIG. 5, the memory cell matrix 1 is divided into a plurality of sub memory cell matrixes (not shown). The row address decoders and drivers 10 selects one sub memory cell matrix within the main memory cell matrix 1, while the row address decoders and drivers 9 selects one row memory cell array within each sub memory cell matrix.

The operation of the FIG. 5 is described below.

When the address signals $\bar{A}_0, \bar{A}_0, A_1, \bar{A}_1, \ldots, A_5, \bar{A}_5$ do not correspond to the defective row address $ADD_x$, the decoder 5 generates the signal RST, the potential of which is in this case low, disabling the driver 8, and thus the redundancy memory cell array 2 is not selected. Simultaneously, the row address decoders and drivers 9 activates, by using the address signals $A_0, \bar{A}_0, A_1$ and $\bar{A}_1$, one of the signal lines, $WD_1$ through $WD_4$. These lines are applied to the row address decoders and drivers 10. The potential of the activated signal line is high while the potential of the others is low. In addition, the row address decoders and drivers 10 select one row memory cell array within the main memory cell matrix 1 by using the address signals $A_2, \bar{A}_2, \ldots, A_5, \bar{A}_5$ and the signal lines $WD_1$ through $WD_4$.

When the address signals $A_0, \bar{A}_0, A_1, \bar{A}_1, \ldots, A_5, \bar{A}_5$ correspond to the defective row address $ADD_x$, the decoder 5 generates the signal RST, the potential of which is, in this case high. This activates driver 8 and selects the redundancy memory cell array 2. In addition, the row address decoders and drivers 9 are disabled by the high potential of the RST signal, which also disables the row address decoders and drivers 10, because each of the signals $WD_1$ through $WD_4$ is low.

The row address decoders and drivers 9 and 10 are described below.

Figure 6:
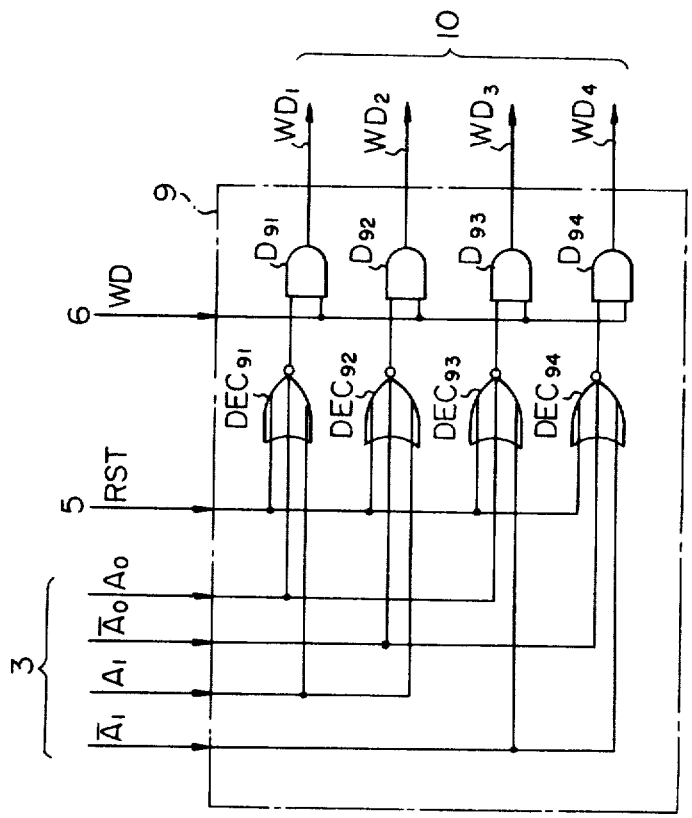
FIGS. 6 and 7 are a logic circuit diagram and a circuit diagram, respectively, of the row address decoders and drivers 9 of FIG. 5.

FIG. 6 is a logic circuit diagram of the row address decoders and drivers 9 of FIG. 5. The row address decoders and drivers 9 comprise decoders $DEC_{91}$ through $DEC_{94}$ formed by NOR gates and word drivers $D_{91}$ through $D_{94}$ formed by AND gates. Each of the decoders $DEC_{91}$ through $DEC_{94}$ has an input connected to the output of the decoder 5 (FIG. 5) and inputs for receiving the address signals $A_0$ (or $\bar{A}_0$) and $A_1$ (or $\bar{A}_1$). In addition, each of the word drivers $D_{91}$ through $D_{94}$ has an input connected to the clock 6 (FIG. 5) and an input connected to one of the outputs of the decoders $DEC_{91}$ through $DEC_{94}$.

In FIG. 6, when the potential of the signal RST is low, only one of the potentials of the outputs of the decoders $DEC_{91}$ through $DEC_{94}$ is high in accordance with the address signals $A_0, \bar{A}_0, A_1$ and $\bar{A}_1$. Therefore, when the potential of the clock signal WD is high, only one of the potentials of the lines $WD_1$ through $WD_4$ is high, and the redundancy memory cell array 2 is not selected. When the potential of the RST signal is high the redundancy memory cell array 2 is selected, and the output potential of each decoder $DEC_{91}$ through $DEC_{94}$ is low, regardless of the state of the address signals. Accordingly, the potential of each of the lines $WD_1$ through $WD_4$ is low. That is, the row address decoders and drivers 9 are disabled.

Figure 7:
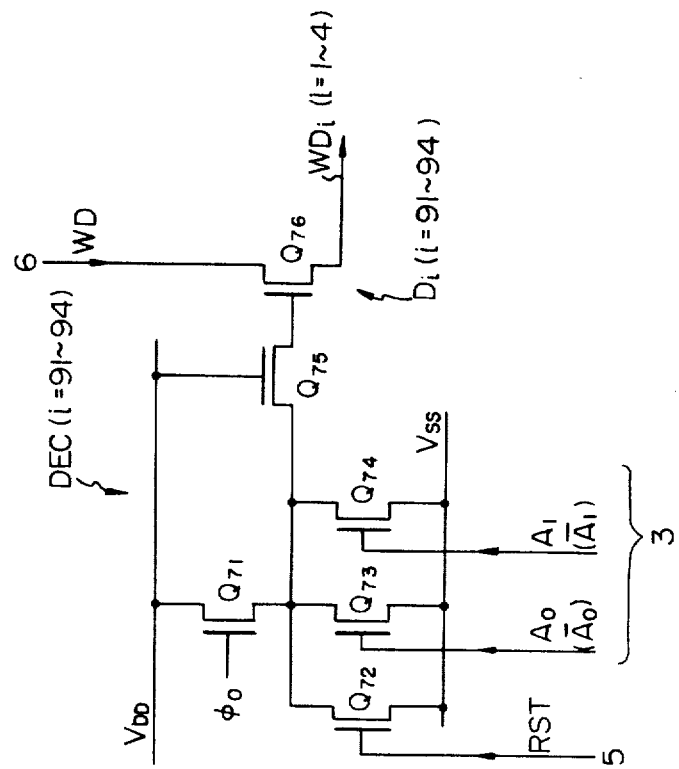

FIG. 7 is a circuit diagram of the row address decoders and drivers 9 of FIG. 5. Each decoder $DEC_i$ (i=91 through 94) comprises a load transistor $Q_{71}$ for receiving a clock signal $\phi_0$, transistors $Q_{72}$, and $Q_{73}$ and $Q_{74}$ for receiving the signals RST, $A_0$ (or $\bar{A}_0$) and $A_1$ (or $\bar{A}_1$), and a transistor $Q_{75}$ serving as a transfer gate. In addition, each of the word drivers $D_i$ (i=91 through 94) comprises a transistor $Q_{76}$ for passing the clock signal WD. FIG 7 differs from a decoder usually used in a semiconductor memory device without a redundancy memory cell array, in that transistor $Q_{72}$ is added as a disabling means. Also, the area of each transistor $Q_{72}$ is relatively small, because the current flowing there through is relatively small.

Figure 8B:
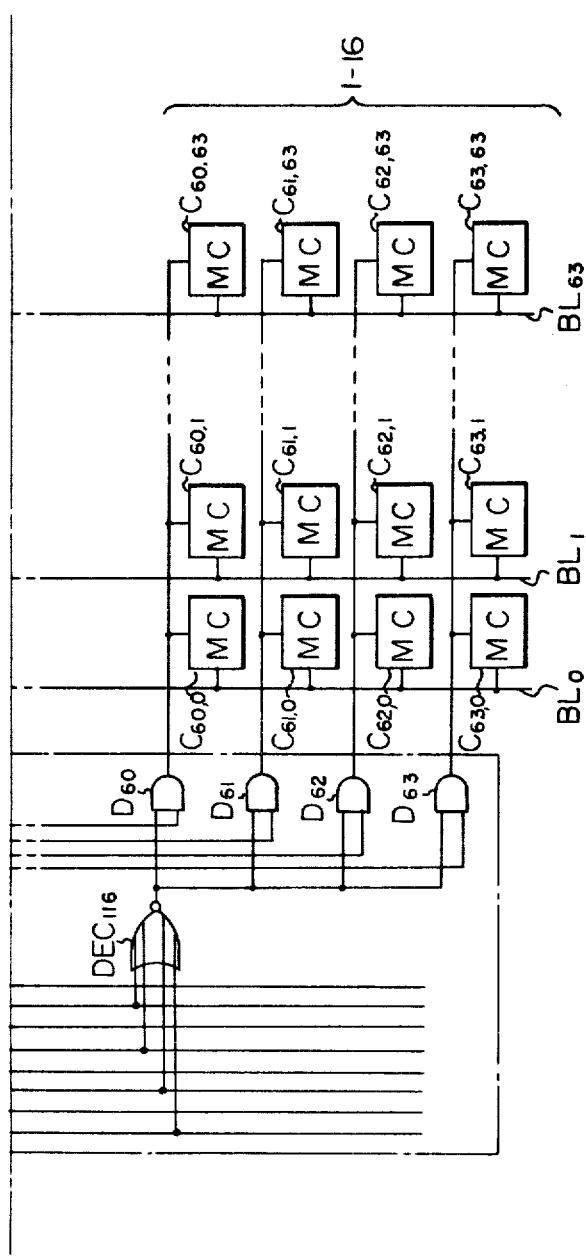

FIG. 8 is a block diagram of the row address decoders and drivers 10 of FIG. 5. The decoders and drivers 10 comprise decoders $DEC_{101}$ through $DEC_{116}$ formed by NOR gates which receive the address signals $A_2$ (or $\bar{A}_2$) $A_3$ (or $\bar{A}_3$), $A_4$ (or $\bar{A}_4$) and $A_5$ (or $\bar{A}_5$), and word drivers $D_0$ through $D_{63}$. In this case, the decoder $DEC_{101}$ is used for selecting a sub memory cell matrix 1-1 comprised of the memory cells $C_{00}, C_{01}, \ldots, C_{0,63}$; $C_{10}, C_{11}, \ldots, C_{1,63}$; $C_{20}, C_{21}, \ldots, C_{2,63}$; $C_{30}, C_{31}, \ldots, C_{3,63}$. Similarly, the other decoders $DEC_{102}$ through $DEC_{116}$ are used for selecting sub memory cell matrixes 1-2. through 1-16, respectively.

In the case where the redundancy memory cell array 2 (FIG. 5) is not selected, the potential of only one of signals $WD_1$ through $WD_4$ is high. For example, if $WD_1$ is high, the word drivers $D_0, D_4, \ldots, D_{60}$ are activated. In addition, the potential of only one of the outputs of the decoders $DEC_{101}$ through $DEC_{108}$ in accordance with the address signals $A_2, \bar{A}_2, \ldots, A_5$ and $\bar{A}_5$ is high; for example, the potential of the output of the decoder $DEC_{101}$ is high. Therefore, only one row memory cell array formed by the memory cells $C_{00}, C_{01}, \ldots, C_{0,63}$ is selected.

When the redundancy memory cell array 2 (FIG. 5) is selected, the potential of each signal $WD_4$ through $WD_1$, is low, and the word drivers $D_0$ through $D_{63}$ are disabled. That is, the row address decoders and drivers 10 are disabled.

Figure 9:
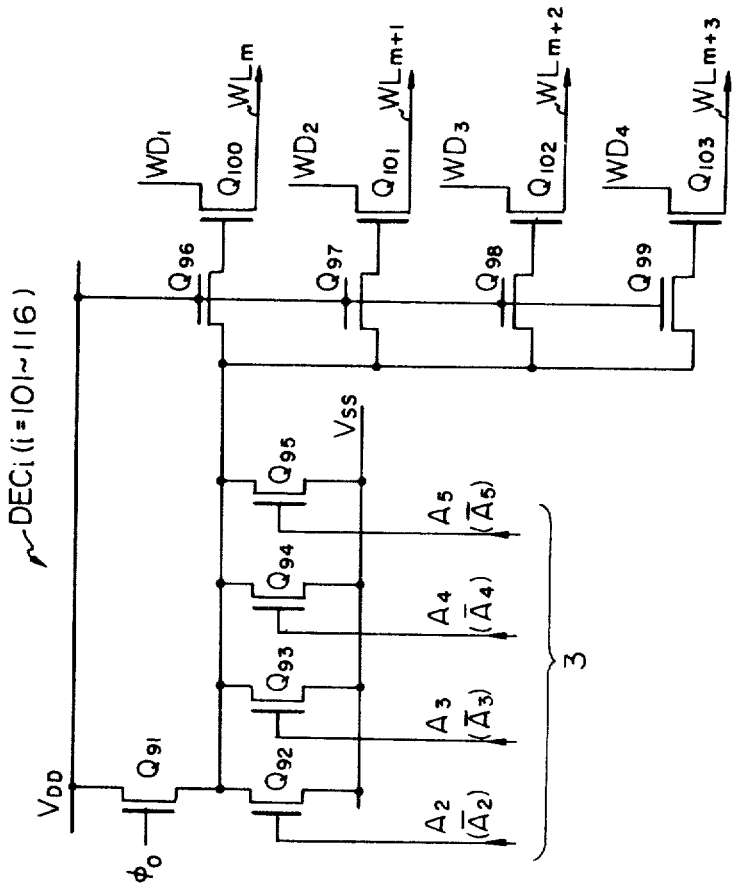

FIG. 9 is a circuit diagram of the row address decoders and drivers 10 of FIG. 5. Each of the decoders $DEC_i$ (i=101 through 116) comprises a load transistor $Q_{91}$ for receiving the clock signal $\phi_0$, transistors $Q_{92}$ through $Q_{95}$ for receiving the address signals $A_2$ (or $\bar{A}_2$) through $A_5$ (or $\bar{A}_5$), transistors $Q_{96}$ through $Q_{99}$ serving as transfer gates connected to transistors $Q_{100}$ through $Q_{103}$ which serve as the word drivers.

As understood from FIGS. 3, through 9, the row address decoders and drivers 9 and 10 according to the present invention are simpler than the row address decoders and drivers 4' of the proposed device. In addition, a reduced number of transistors $Q_{72}$, each having a small area, are used in the device.

Figure 10:
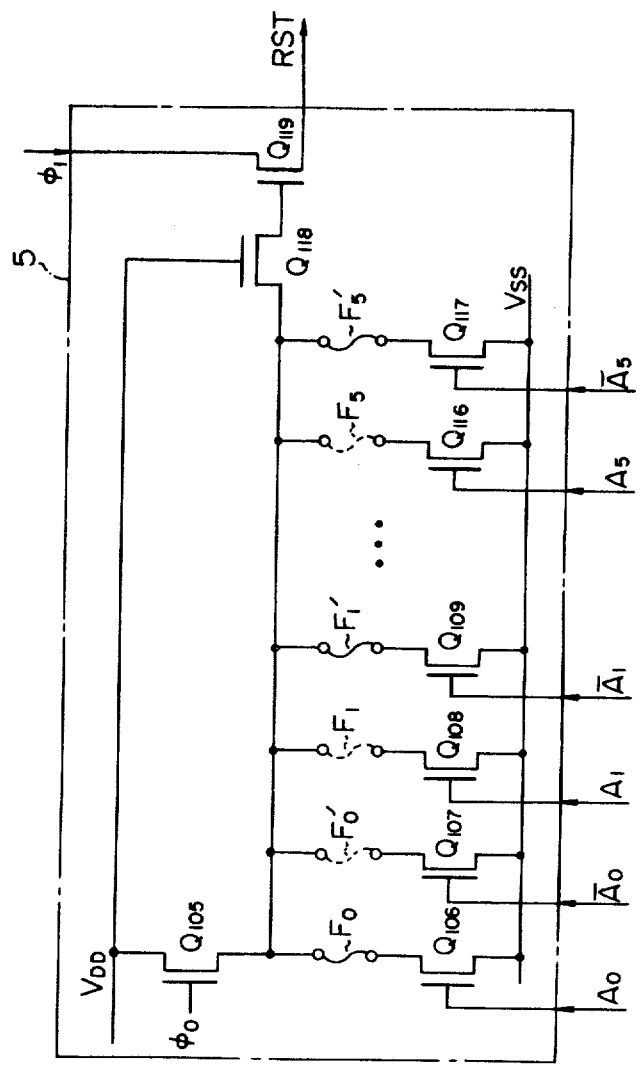
FIG. 10 is a circuit diagram of the decoder (PROM) 5 of FIG. 5.

FIG. 10 is a circuit diagram of the decoder 5 of FIG. 5. The decoder 5 is a PROM of a fuse type which comprises a load transistor $Q_{105}$, transistors $Q_{106}$ through $Q_{117}$ for receiving the address signals $A_0, \bar{A}_0, A_1, \bar{A}_1, \ldots, A_5, \bar{A}_5$, respectively, and a transistor $Q_{118}$ serving as a transfer gate. Further, the transistors $Q_{106}$ through $Q_{117}$ are connected through fuses $F_0, F_0', F_1, F_1', \ldots, F_5, F_5'$ to the transistor $Q_{105}$. If a defective memory cell is detected in the main memory cell matrix 1 (FIG. 1), the address of the row containing the defective memory cell, is written into the decoder 5. That is, the fuses such as $F_0', F_1$ and $F_5$ are melted down by a programming means (not shown).

It should be noted that in FIG. 5, one redundancy memory cell array 2 is incorporated with the main memory matrix 1. This scheme allows the device of FIG. 5 to be used as a fully functional device even though there may be one or more defective memory cells in one row array. However, in order to save two or more defective memory cells in different row memory cell arrays, two or more redundancy memory cell arrays 2 must be provided. In this case, there can be more than one decoder 5 and more than one redundancy memory cell array 2. In addition, in FIG. 5, the redundancy memory cell array 2 is incorporated with the main memory cell matrix 1 along the rows thereof, but the redundancy memory cell array 2 can also be incorporated with the main memory cell matrix 1 along the columns thereof.

As explained above, the semiconductor memory device according to the present invention has an advantage, as compared with the proposed device, in that the area of the entire device is reduced, since the decoders and drivers are small.

What is claimed is:

1. A semiconductor memory device comprising:
   a main memory cell matrix having a plurality of sub memory cell matrixes, each sub memory cell matrix having a plurality of memory cell arrays;
   a redundancy memory cell array incorporated into said main memory cell matrix;
   a first decoder means having a plurality of inputs for receiving a first sub-part of a first address information having n bits and a first clock signal and having a plurality of outputs, for selecting one memory cell array parallel to said redundancy memory cell array and within each said sub memory cell matrix, in accordance with said first sub-part, of said first address information, said outputs of said first decoder means triggered by said first clock signal;
   a second decoder means having a plurality of inputs for receiving a second sub-part of said first address information having m bits and said outputs of said first decoder means and having a plurality of output drivers, for selecting one of said sub memory cell matrixes within said main memory cell matrix, in accordance with said second sub-part of said first address information, said output drivers of said second decoder means triggered by said outputs of said first decoder means and select one memory cell array within said memory cell matrix;
   a third decoder means having a plurality of inputs for receiving said first address information having n+m bits and an output operatively connected to said redundancy memory cell array and to said first decoder means for selecting said redundancy memory cell array and disabling said second decoder means, in accordance with said first address information,
   said output drivers of said second decoder means being disabled when said third decoder means selects said redundancy memory cell array; and
   a fourth decoder means having a plurality of inputs for receiving a second address information, for selecting one memory cell array perpendicular to said redundancy memory cell array within said main memory cell matrix and said redundancy memory array, in accordance with said second address information.

2. A device as set forth in claim 1, wherein said redundancy memory cell array is incorporated with said main memory cell matrix as a row array, and said first and second address information are row and column address information, respectively.

3. A device as set forth in claim 1, wherein said redundancy memory cell array is incorporated with said main memory cell matrix as a column array, and said first and second address information are column and row address information, respectively.

4. A device as set forth in claim 1, wherein said third decoder means comprises a PROM for storing address information corresponding to the memory cell array containing a defective memory cell, said address is stored in said PROM when said defective memory cell is detected in said main memory cell matrix.

5. A device as set forth in claim 4, wherein said PROM is of a fuse type.

6. A device according to claim 5, wherein said third decoder further comprises:
   (a) a plurality of parallel transistors, each having (i) a gate for receiving a bit of said first address information, (ii) a drain for receiving a first supply voltage, and (iii) a source;
   (b) a plurality of fuses each having a first input correspondingly, operatively connected to said sources of said plurality of parallel transistors, and a second input;
   (c) a load transistor having (i) a gate for receiving a second clock signal, (ii) a drain operatively connected to said second input of each of said plurality of fuses, and (iii) a source for receiving a second supply voltage;
   (d) a pass transistor having (i) a gate for receiving said second supply voltage, (ii) a drain operatively connected to said drain of said load transistor, and (iii) a source;
   (e) a drive transistor having (i) a gate operatively connected to said source of said pass transistor, (ii) a drain corresponding to said output of said third decoder means, and (iii) a source for receiving a third clock.

7. A device as set forth in claim 1, wherein said first decoder means comprises:
   a plurality of NOR gates each having an input operatively connected to said output of said third decoder means and having inputs for receiving said first part of said first information and each having an output; and
   a plurality of AND gates each having an input operatively connected to said output of one of said NOR gates.

8. A device as set forth in claim 1, wherein said second decoder means comprises:

a plurality of NOR gates each having an output and inputs for receiving said second sub-part of said first address information; and a plurality of AND gates each having inputs correspondingly, operatively connected to said output of one of said NOR gates and to one of said outputs of said first decoder means and each having an output operatively connected to one memory cell array, parallel to said redundancy memory cell array, of said main memory cell matrix.

9. A device according to claim 7 or 8, wherein each NOR gate of said plurality of NOR gates further comprises:

(a) a load transistor having (i) a gate for receiving a second clock signal, (ii) a source for receiving a first supply voltage, and (iii) a drain;

(b) a pass transistor having (i) a gate for receiving said first supply voltage, (ii) a source, and (iii) a drain;

(c) a plurality of parallel transistors, each having (i) a gate corresponding to one of said inputs of said NOR gates, (ii) a drain for receiving a second supply voltage, and (iii) a source operatively connected to said drain of said load transistor, to said drain of said pass transistor, and to the source of the remaining transistors of said plurality of parallel transistors.

10. A device according to claim 7 or 8, wherein each AND gate of said plurality of AND gates further comprises a transistor having a gate and source respectively corresponding to said plurality of inputs of said AND gate, and a drain corresponding to said output of said AND gate.

* * * * *